United States Patent
Konaka

(10) Patent No.: US 11,855,605 B2
(45) Date of Patent: Dec. 26, 2023

(54) ACOUSTIC WAVE FILTER DEVICE AND MULTIPLEXER

(71) Applicant: Murata Manufacturing Co., Ltd., Nagaokakyo (JP)

(72) Inventor: Yohei Konaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 362 days.

(21) Appl. No.: 17/412,313

(22) Filed: Aug. 26, 2021

(65) Prior Publication Data

US 2021/0384886 A1    Dec. 9, 2021

Related U.S. Application Data

(63) Continuation of application No. PCT/JP2020/010674, filed on Mar. 11, 2020.

(30) Foreign Application Priority Data

Mar. 13, 2019   (JP) .................................. 2019-046196

(51) Int. Cl.
*H03H 9/145*    (2006.01)
*H03H 9/25*    (2006.01)
(Continued)

(52) U.S. Cl.
CPC ............. *H03H 9/145* (2013.01); *H03H 9/25* (2013.01); *H03H 9/64* (2013.01); *H03H 9/72* (2013.01)

(58) Field of Classification Search
CPC ............ H03H 9/145; H03H 9/25; H03H 9/64; H03H 9/72
See application file for complete search history.

(56) References Cited

U.S. PATENT DOCUMENTS

| 2004/0155730 A1 | 8/2004 | Iwamoto et al. |
| 2008/0169882 A1 | 7/2008 | Ono et al. |

(Continued)

FOREIGN PATENT DOCUMENTS

| JP | 2003-249842 A | 9/2003 |
| JP | 2008-172543 A | 7/2008 |

(Continued)

OTHER PUBLICATIONS

Office Action in JP2021-505117, dated Jun. 28, 2022, 3 pages.
Official Communication issued in International Patent Application No. PCT/JP2020/010674, dated Jun. 16, 2020.

*Primary Examiner* — Daniel C Puentes
(74) *Attorney, Agent, or Firm* — Keating & Bennett, LLP

(57) ABSTRACT

An acoustic wave filter device includes a first longitudinally coupled acoustic wave resonator including an odd number of first IDT electrodes arranged along an acoustic wave propagation direction and a second longitudinally coupled acoustic wave resonator including an odd number of second IDT electrodes arranged in the acoustic wave propagation direction. Among the first IDT electrodes, the odd-numbered IDT electrodes are connected to a node and the even-numbered IDT electrodes are connected to a node. Among the second IDT electrodes, the odd-numbered IDT electrodes are connected to the node and the even-numbered IDT electrodes are connected to the node. The number of first IDT electrodes connected to the node and the number of second IDT electrodes connected to the node are the same.

18 Claims, 15 Drawing Sheets

(51) Int. Cl.
    *H03H 9/64*     (2006.01)
    *H03H 9/72*     (2006.01)

(56) References Cited

U.S. PATENT DOCUMENTS

| | | |
|---|---|---|
| 2011/0193654 A1 | 8/2011 | Miyake |
| 2016/0049920 A1 | 2/2016 | Kishino |
| 2018/0131349 A1 | 5/2018 | Takata |
| 2018/0269854 A1 | 9/2018 | Kishino |
| 2021/0021256 A1 * | 1/2021 | Okada .................... H03H 9/605 |

FOREIGN PATENT DOCUMENTS

| | | | |
|---|---|---|---|
| JP | 2017-118587 A | | 6/2017 |
| JP | 2018-074539 A | | 5/2018 |
| WO | 2010052969 A1 | | 5/2010 |
| WO | 2016088804 A1 | | 6/2016 |

\* cited by examiner (a) EXAMPLE

IMPEDANCE CHARACTERISTICS OF
INPUT/OUTPUT TERMINAL 110

(b) EXAMPLE

IMPEDANCE CHARACTERISTICS OF
INPUT/OUTPUT TERMINAL 120

(b) COMPARATIVE EXAMPLE

IMPEDANCE CHARACTERISTICS OF INPUT/OUTPUT TERMINAL 120

(a) COMPARATIVE EXAMPLE

IMPEDANCE CHARACTERISTICS OF INPUT/OUTPUT TERMINAL 110

ACOUSTIC WAVE FILTER DEVICE AND MULTIPLEXER

CROSS REFERENCE TO RELATED APPLICATIONS

This application claims the benefit of priority to Japanese Patent Application No. 2019-046196 filed on Mar. 13, 2019 and is a Continuation Application of PCT Application No. PCT/JP2020/010674 filed on Mar. 11, 2020. The entire contents of each application are hereby incorporated herein by reference.

BACKGROUND OF THE INVENTION

1. Field of the Invention

The present invention relates to an acoustic wave filter device and a multiplexer including the acoustic wave filter device.

2. Description of the Related Art

In communication devices, such as cellular phones, acoustic wave filter devices, such as longitudinally coupled surface acoustic wave filters or ladder surface acoustic wave filters have been used.

Japanese Unexamined Patent Application Publication No. 2003-249842 discloses a multiplexer in which a ladder surface acoustic wave filter and a longitudinally coupled surface acoustic wave filter are connected to a common terminal. In the longitudinally coupled surface acoustic wave filter included in the multiplexer, two dual-mode surface acoustic wave filters are connected in parallel. Each of the two dual-mode surface acoustic wave filters is formed of three IDTs (interdigital transducers).

In the longitudinally coupled surface acoustic wave filter disclosed in Japanese Unexamined Patent Application Publication No. 2003-249842, an insertion loss is reduced because of the parallel connection of the two dual-mode surface acoustic wave filters. However, since the number of IDT electrodes (two) connected to the common terminal (input terminal) and the number of IDT electrodes (four) connected to a reception-side terminal (output terminal) are different, a large difference between an input impedance and an output impedance is produced. Accordingly, for example, the degree of flexibility in impedance matching with an external connection circuit in the longitudinally coupled surface acoustic wave filter and the degree of flexibility in impedance adjustment for the ladder surface acoustic wave filter connected to the common terminal in the multiplexer are limited. This leads to the degradation in the bandpass characteristics of the longitudinally coupled surface acoustic wave filter and the multiplexer.

SUMMARY OF THE INVENTION

Preferred embodiments of the present invention provide acoustic wave filter devices in each of which a difference between an input impedance and an output impedance is reduced, and provide multiplexers each including such acoustic wave filter devices.

An acoustic wave filter device according to a preferred embodiment of the present invention includes a first longitudinally coupled acoustic wave resonator including an odd number, greater than one, of first IDT (interdigital transducer) electrodes arranged in an acoustic wave propagation direction, a second longitudinally coupled acoustic wave resonator including an odd number, greater than one, of second IDT electrodes arranged in the acoustic wave propagation direction, a first node and a second node different from the first node, and a first input/output terminal connected to the first node and a second input/output terminal connected to the second node. Each of the odd number of first IDT electrodes and the odd number of second IDT electrodes includes a pair of comb-shaped electrodes each including a busbar electrode and a plurality of electrode fingers that are connected to the busbar electrode and that extend in a direction crossing the acoustic wave propagation direction, one of the pair of comb-shaped electrodes included in each of odd-numbered first IDT electrodes in the acoustic wave propagation direction among the odd number of first IDT electrodes is connected to the first node and another one of the pair of comb-shaped electrodes is connected to a ground. One of the pair of comb-shaped electrodes included in each of even-numbered first IDT electrodes in the acoustic wave propagation direction among the odd number of first IDT electrodes is connected to the ground and another one of the pair of comb-shaped electrodes is connected to the second node. One of the pair of comb-shaped electrodes included in each of odd-numbered second IDT electrodes in the acoustic wave propagation direction among the odd number of second IDT electrodes is connected to the ground and another one of the pair of comb-shaped electrodes is connected to the second node. One of the pair of comb-shaped electrodes included in each of the even-numbered second IDT electrodes in the acoustic wave propagation direction among the odd number of second IDT electrodes is connected to the first node and another one of the pair of comb-shaped electrodes is connected to the ground. A sum of the number of first IDT electrodes connected to the first node and the number of second IDT electrodes connected to the first node and a sum of the number of first IDT electrodes connected to the second node and the number of second IDT electrodes connected to the second node are equal.

According to preferred embodiments of the present invention, acoustic wave filter devices are provided, in each of which, a difference between an input impedance and an output impedance is reduced, and multiplexers each including such acoustic wave filter devices are also provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
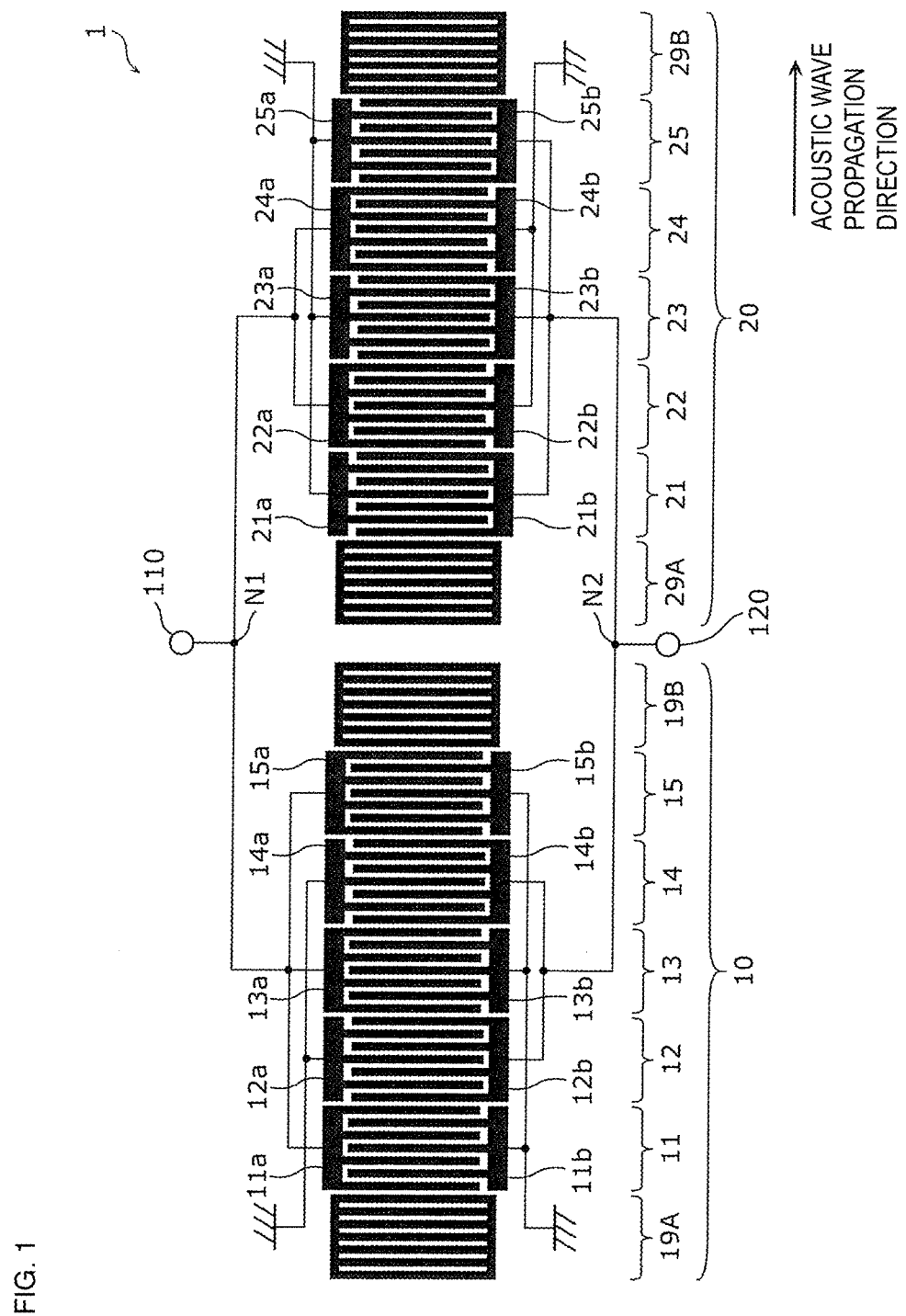
FIG. 1 is a diagram illustrating the circuit configuration of an acoustic wave filter device according to a first preferred embodiment of the present invention.

Preferred embodiments of the present invention will be described in detail below with reference to drawings. The preferred embodiments described below are comprehensive or concrete examples. The numerical values, shapes, materials, elements, the arrangement and connection configuration of the elements to be described in the following preferred embodiments are merely illustrative examples, and are not intended to limit the present invention. Among the elements included in the following preferred embodiments, those not recited in the independent claims of the present invention are described as optional elements. The sizes or the ratio of sizes of the elements illustrated in the drawings are not necessarily precise.

As used herein, a "node" refers to a point on a continuous transmission line (equipotential in terms of DC) including, for example, a wiring line along which radio frequency signals propagate, an electrode directly connected to the wiring line, and a terminal directly connected to the wiring line or the electrode.

First Preferred Embodiment

1-1. Configuration of Acoustic Wave Filter Device 1

FIG. 1 is a diagram illustrating the circuit configuration of an acoustic wave filter device 1 according to a first preferred embodiment of the present invention. FIG. 1 illustrates the planar layout of IDT electrodes included in the acoustic wave filter device 1 and the state of connection between the IDT electrodes. A typical planar layout of IDT electrodes in the acoustic wave filter device 1 is illustrated in FIG. 1, and the number of electrode fingers in each IDT electrode and the length and electrode finger pitch of electrode fingers are not limited to those illustrated FIG. 1.

As illustrated in FIG. 1, the acoustic wave filter device according to the present preferred embodiment includes longitudinally coupled acoustic wave resonators 10 and 20 and input/output terminals 110 and 120.

The longitudinally coupled acoustic wave resonator 10 is an example of a first longitudinally coupled acoustic wave resonator and includes, for example, five IDT electrodes 11, 12, 13, 14, and 15 and reflectors 19A and 19B. The longitudinally coupled acoustic wave resonator 20 is an example of a second longitudinally coupled acoustic wave resonator and includes, for example, five IDT electrodes 21, 22, 23, 24, and 25 and reflectors 29A and 29B. The IDT electrodes 11 to 15 are an odd number of first IDT electrodes arranged in an acoustic wave propagation direction. The IDT electrodes 21 to 25 are an odd number of second IDT electrodes arranged in the acoustic wave propagation direction. The number of IDT electrodes included in the longitudinally coupled acoustic wave resonator 10 does not necessarily have to be five and may be any odd number. The number of IDT electrodes included in the longitudinally coupled acoustic wave resonator 20 does not necessarily have to be five and may be any odd number.

The reflectors 19A and 19B sandwich the IDT electrodes 11 to 15 in the acoustic wave propagation direction. The reflectors 29A and 29B sandwich the IDT electrodes 21 to 25 in the acoustic wave propagation direction. The longitudinally coupled acoustic wave resonator 10 does not have to include the reflectors 19A and 19B. The longitudinally coupled acoustic wave resonator 20 does not have to include the reflectors 29A and 29B.

The IDT electrodes 11 to 15 and 21 to 25 and the reflectors 19A, 19B, 29A, and 29B are provided on a substrate having piezoelectricity. The IDT electrodes 11 to 15 and 21 to 25 and the substrate having piezoelectricity define a surface acoustic wave resonator. The configuration of a surface acoustic wave resonator will be described.

Figure 2A:
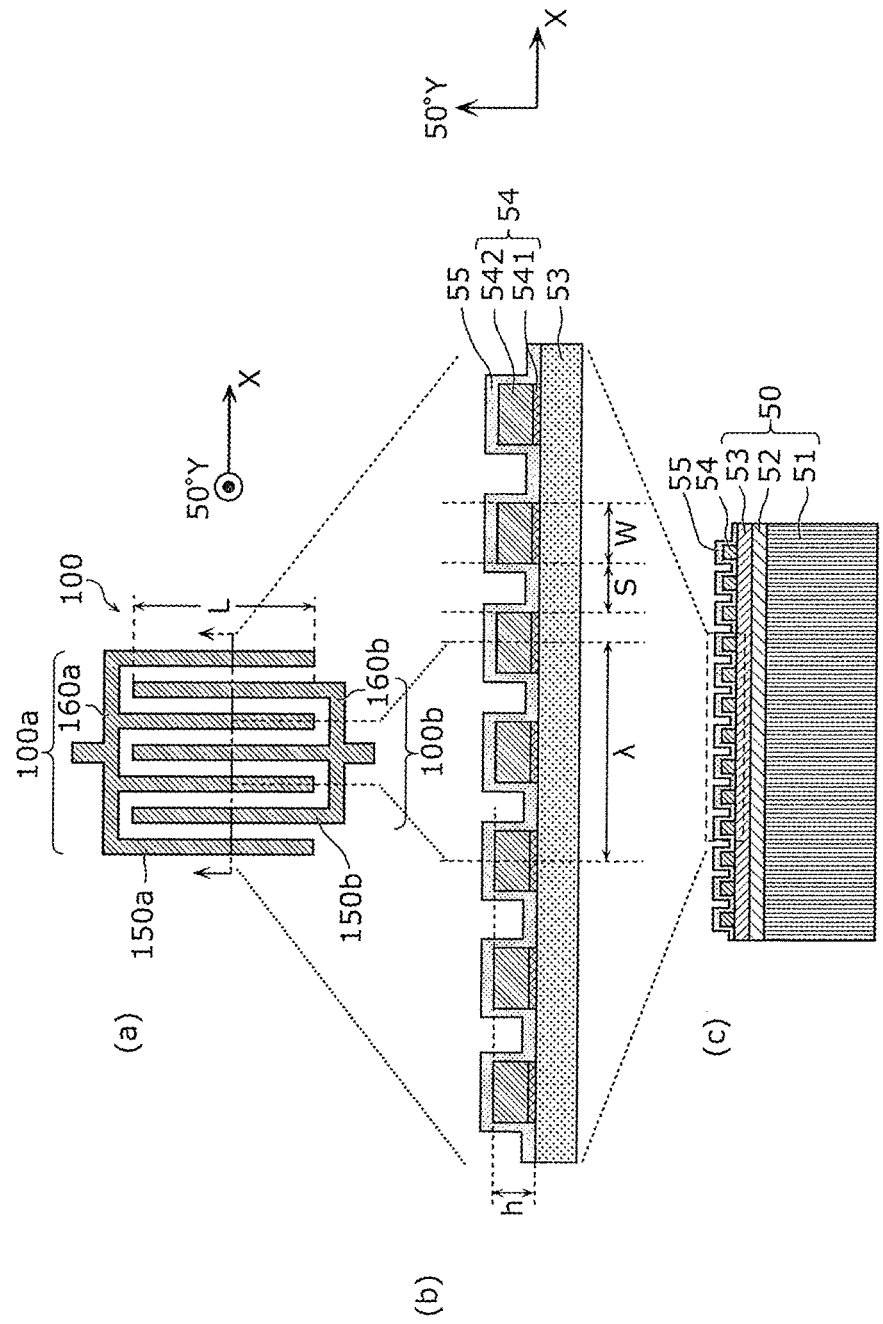
FIG. 2A is a schematic plan view and cross-sectional view of an example of a surface acoustic wave resonator according to the first preferred embodiment of the present invention.

FIG. 2A is a schematic plan view and cross-sectional view of an example of a surface acoustic wave resonator according to the first preferred embodiment. FIG. 2A illustrates a surface acoustic wave resonator 100 having a basic structure of a surface acoustic wave resonator defining the acoustic wave filter device 1. The surface acoustic wave resonator 100 illustrated in FIG. 2A is used for the description of the basic structure of a surface acoustic wave resonator, and the number of electrode fingers in each electrode and the length and electrode finger pitch of electrode fingers are not limited to those illustrated in FIG. 2A.

The surface acoustic wave resonator 100 includes a substrate 50 having piezoelectricity and comb-shaped electrodes 100a and 100b.

As illustrated in part (a) of FIG. 2A, a pair of comb-shaped electrodes 100a and 100b facing each other are provided on the substrate 50. The comb-shaped electrode 100a includes a plurality of electrode fingers 150a parallel or substantially parallel to each other and a busbar electrode 160a connecting the multiple electrode fingers 150a. The comb-shaped electrode 100b includes a plurality of electrode fingers 150b parallel or substantially parallel to each other and a busbar electrode 160b connecting the multiple electrode fingers 150b. The multiple electrode fingers 150a and the multiple electrode fingers 150b extend along a direction orthogonal or substantially orthogonal to an acoustic wave propagation direction (X-axis direction).

An IDT electrode 54 including the multiple electrode fingers 150a, the multiple electrode fingers 150b, and the busbar electrodes 160a and 160b has a structure in which an adhesion layer 541 and a main electrode layer 542 are laminated as illustrated in part (b) of FIG. 2A.

The adhesion layer 541 improves the contact between the substrate 50 and the main electrode layer 542 and is made of, for example, Ti. The film thickness of the adhesion layer 541 is, for example, about 12 nm.

As a material for the main electrode layer 542, for example, Al including about 1% Cu is used. The film thickness of the main electrode layer 542 is, for example, about 162 nm.

A protective layer 55 covers the comb-shaped electrodes 100a and 100b. The protective layer 55 protects the main electrode layer 542 from an external environment, adjusts frequency temperature characteristics, increases moisture resistance, and is a dielectric film mainly made of, for example, silicon dioxide. The thickness of the protective layer 55 is, for example, about 25 nm.

As materials for the adhesion layer 541, the main electrode layer 542, and the protective layer 55, the above materials do not have to be used. The IDT electrode 54 does not have to have the above laminated structure. The IDT electrode 54 may be made of, for example, metal or an alloy of Ti, Al, Cu, Pt, Au, Ag, Pd, or the like, or may include a plurality of multilayer bodies made of the above metal or alloy. The protective layer 55 does not have to be provided.

Next, the laminated structure of the substrate 50 will be described.

As illustrated in part (c) of FIG. 2A, the substrate 50 includes a high acoustic velocity support substrate 51, a low acoustic velocity film 52, and a piezoelectric film 53 and has a structure in which the high acoustic velocity support substrate 51, the low acoustic velocity film 52, and the piezoelectric film 53 are laminated in this order.

The piezoelectric film 53 is made of, for example, a 50° Y-cut X-propagation $LiTaO_3$ piezoelectric single crystal or piezoelectric ceramics (a lithium tantalate single crystal cut by a plane with a normal line that is an axis rotated by about 50° from a Y-axis with an X-axis as a center axis or ceramics, and a surface acoustic wave propagates in an X-axis direction in the single crystal or ceramics). The thickness of the piezoelectric film 53 is, for example, about 600 nm. The material and cut angle of a piezoelectric single crystal used as the piezoelectric film 53 are selected as appropriate in accordance with the requirements of each filter.

The high acoustic velocity support substrate 51 supports the low acoustic velocity film 52, the piezoelectric film 53, and the IDT electrode 54. Furthermore, the high acoustic velocity support substrate 51 is a substrate in which the acoustic velocity of a bulk wave is higher than that of an acoustic wave such as a surface acoustic wave or a boundary wave propagating through the piezoelectric film 53, and confines a surface acoustic wave to a portion where the piezoelectric film 53 and the low acoustic velocity film 52 are laminated and prevents the surface acoustic wave from leaking below an interface between the low acoustic velocity film 52 and the high acoustic velocity support substrate 51.

The high acoustic velocity support substrate 51 is, for example, a silicon substrate and has a thickness of, for example, about 200 μm.

The low acoustic velocity film 52 is a film in which the acoustic velocity of a bulk wave is lower than that of a bulk wave propagating through the piezoelectric film 53, and is disposed between the piezoelectric film 53 and the high acoustic velocity support substrate 51. The above structure and the nature of an acoustic wave that energy concentrates in a low-acoustic-velocity medium reduce or prevent the leakage of surface acoustic wave energy to the outside of the IDT electrode. The low acoustic velocity film 52 is mainly made of, for example, silicon dioxide and has a thickness of, for example, about 670 nm.

With the laminated structure of the substrate 50, a Q value at a resonant frequency and an anti-resonant frequency can be significantly increased as compared with a case where a structure in the related art is used in which a piezoelectric substrate is used as a single layer. That is, since a surface acoustic wave resonator having a high Q value can be provided, it is possible to provide a filter having a small insertion loss by using the surface acoustic wave resonator.

The high acoustic velocity support substrate 51 may have a structure in which a support substrate and a high acoustic velocity film in which the acoustic velocity of a bulk wave propagating therethrough is higher than that of an acoustic wave such as a surface acoustic wave or a boundary wave propagating through the piezoelectric film 53 are laminated. In this case, for the support substrate, it is possible to use a piezoelectric body such as, for example, lithium tantalate, lithium niobate, or crystal, various ceramics such as sapphire, alumina, magnesia, silicon nitride, aluminum nitride, silicon carbide, zirconia, cordierite, mullite, steatite, forsterite, etc., a dielectric such as glass, a semiconductor such as silicon or gallium nitride, or a resin substrate can be used. For the high acoustic velocity film, various high acoustic velocity materials can be used, such as aluminum nitride, aluminum oxide, silicon carbide, silicon nitride, silicon oxynitride, a DLC film, diamond, a medium mainly made of the above material, and a medium mainly made of the mixture of the above materials.

Figure 2B:
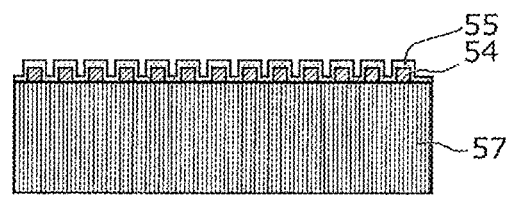
FIG. 2B is a schematic cross-sectional view of a surface acoustic wave resonator according to a modification of a preferred embodiment of the present invention.

FIG. 2B is a schematic cross-sectional view of a surface acoustic wave resonator according to a modification of a preferred embodiment of the present invention. In the surface acoustic wave resonator 100 illustrated in FIG. 2A, the IDT electrode 54 is provided on the substrate 50 including the piezoelectric film 53. A substrate on which the IDT electrode 54 is provided may be a piezoelectric single crystal substrate 57 including a single piezoelectric layer illustrated in FIG. 2B. The piezoelectric single crystal substrate 57 is made of, for example, a $LiNbO_3$ piezoelectric single crystal. The surface acoustic wave resonator 100 according to this modification includes the piezoelectric single crystal substrate 57 made of $LiNbO_3$, the IDT electrode 54, and the protective layer 55 provided on the piezoelectric single crystal substrate 57 and the IDT electrode 54.

The laminated structure, material, cut angle, and thickness of each of the piezoelectric film 53 and the piezoelectric single crystal substrate 57 may be changed as appropriate based on the required bandpass characteristics of an acoustic wave filter device. The surface acoustic wave resonator 100 including a $LiTaO_3$ piezoelectric substrate having a cut angle other than the above cut angle can also obtain an advantageous effect the same as or similar to that obtained by the surface acoustic wave resonator 100 including the above piezoelectric film 53.

A substrate on which the IDT electrode 54 is provided may have a structure in which a support substrate, an energy confinement layer, and a piezoelectric film are laminated in this order. The IDT electrode 54 is provided on the piezoelectric film. The piezoelectric film is made of, for example, LiTaO$_3$ piezoelectric single crystal or piezoelectric ceramics. The support substrate supports the piezoelectric film, the energy confinement layer, and the IDT electrode 54.

The energy confinement layer includes one or more layers, and the acoustic velocity of a bulk acoustic wave propagating through at least one of these layers is higher than that of an acoustic wave propagating through the surroundings of the piezoelectric film. For example, the energy confinement layer may have a laminated structure including a low acoustic velocity layer and a high acoustic velocity layer. The low acoustic velocity layer is a film in which the acoustic velocity of a bulk wave is lower than that of a bulk wave propagating through the piezoelectric film. The high acoustic velocity layer is a film in which the acoustic velocity of a bulk wave is higher than that of an acoustic wave propagating through the piezoelectric film. The support substrate may be a high acoustic velocity layer.

The energy confinement layer may be an acoustic impedance layer having a structure in which a low acoustic impedance layer in which an acoustic impedance is relatively low and a high acoustic impedance layer in which an acoustic impedance is relatively high are alternately laminated.

Here, exemplary electrode parameters of the IDT electrode included in the surface acoustic wave resonator 100 will be described.

The wavelength of a surface acoustic wave resonator is defined by a wavelength λ, which is a repetition period of the multiple electrode fingers 150a or 150b included in the IDT electrode 54 illustrated in part (b) of FIG. 2A. The electrode pitch is half of the wavelength λ, and is defined by (W+S) where W represents the line width of the electrode fingers 150a and 150b included in the comb-shaped electrodes 100a and 100b and S represents the space width between the adjacent electrode fingers 150a and 150b. A cross width L of a pair of the comb-shaped electrodes 100a and 100b is, as illustrated in part (a) of FIG. 2A, the length of electrode fingers that overlap each other when viewed in the acoustic wave propagation direction (X-axis direction) of the electrode fingers 150a and 150b. The electrode duty of each surface acoustic wave resonator is the line width occupancy of the multiple electrode fingers 150a and 150b, which is the line width ratio relative to the sum of the line width and the space width of the multiple electrode fingers 150a and 150b, and which is defined by W/(W+S). Number of pairs N of the IDT electrode 54 represents the average of the number of the multiple electrode fingers 150a and the number of the multiple electrode fingers 150b where the adjacent electrode fingers 150a and 150b are a pair.

The height of the comb-shaped electrodes 100a and 100b is represented by h. In the following, parameters related to the IDT electrode of a surface acoustic wave resonator, such as the wavelength λ, the cross width L, the electrode duty, the number of IDT pairs, and the height h of the IDT electrode 54, are referred to as electrode parameters.

Referring back to FIG. 1, the configuration of the acoustic wave filter device 1 according to the first preferred embodiment will be described.

As described with reference to FIG. 2A, each of the IDT electrodes 11 to 15 and 21 to 25 includes a pair of comb-shaped electrodes each including a busbar electrode extending in an acoustic wave propagation direction and multiple electrode fingers that are connected to the busbar electrode and extend in a direction crossing the acoustic wave propagation direction.

Among the IDT electrodes 11 to 15, the IDT electrodes 11, 13, and 15 are disposed at odd-numbered positions in the acoustic wave propagation direction. One (busbar electrodes 11a, 13a, and 15a) of the pair of comb-shaped electrodes included in each of the IDT electrodes 11, 13, and 15 is connected to a node N1 (first node), and the other one (busbar electrodes 11b, 13b, and 15b) of them is connected to the ground.

Among the IDT electrodes 11 to 15, the IDT electrodes 12 and 14 are disposed at even-numbered positions in the acoustic wave propagation direction. One (busbar electrodes 12a and 14a) of the pair of comb-shaped electrodes included in each of the IDT electrodes 12 and 14 is connected to the ground, and the other one (busbar electrodes 12b and 14b) of them is connected to a node N2 (second node) different from the node N1.

The node N1 is connected to the input/output terminal 110. The node N2 is connected to the input/output terminal 120.

Among the IDT electrodes 21 to 25, the IDT electrodes 21, 23, and 25 are disposed at odd-numbered positions in the acoustic wave propagation direction. One (busbar electrodes 21a, 23a, and 25a) of the pair of comb-shaped electrodes included in each of the IDT electrodes 21, 23, and 25 is connected to the ground, and the other one (busbar electrodes 21b, 23b, and 25b) of them is connected to the node N2.

Among the IDT electrodes 21 to 25, the IDT electrodes 22 and 24 are disposed at even-numbered positions in the acoustic wave propagation direction. One (busbar electrodes 22a and 24a) of the pair of comb-shaped electrodes included in each of the IDT electrodes 22 and 24 is connected to the node N1, and the other one (busbar electrodes 22b and 24b) of them is connected to the ground.

The longitudinally coupled acoustic wave resonator 10 having the above structure defines and functions as a bandpass filter having a first passband. The longitudinally coupled acoustic wave resonator 20 defines and functions as a bandpass filter having a second passband.

In the acoustic wave filter device 1 according to the present preferred embodiment, the sum (for example, five) of the number of first IDT electrodes connected to the node N1 (for example, the three IDT electrodes 11, 13, and 15) and the number of second IDT electrodes connected to the node N1 (for example, the two IDT electrodes 22 and 24) and the sum (for example, five) of the number of first IDT electrodes connected to the node N2 (for example, the two IDT electrodes 12 and 14) and the number of second IDT electrodes connected to the node N2 (for example, the three IDT electrodes 21, 23, and 25) are equal.

In the acoustic wave filter device 1 according to the present preferred embodiment, since the number of IDT electrodes connected to the input/output terminal 110 (for example, five) and the number of IDT electrodes connected to the input/output terminal 120 (for example, five) are the same, the difference between an impedance seen by the input/output terminal 110 of the acoustic wave filter device 1 and an impedance seen by the input/output terminal 120 of the acoustic wave filter device 1 can be reduced. Accordingly, regardless of whether an external circuit is connected to the input/output terminal 110 or 120 of the acoustic wave filter device 1, the impedance matching with the external circuit can be adjusted. In addition, in a multiplexer, the degree of flexibility in impedance adjustment for another filter connected to a common terminal is increased.

In the acoustic wave filter device 1 according to the present preferred embodiment, the number of first IDT electrodes included in the longitudinally coupled acoustic wave resonator 10 and the number of second IDT electrodes included in the longitudinally coupled acoustic wave resonator 20 are the same. Accordingly, the longitudinally coupled acoustic wave resonators 10 and 20 connected in parallel with each other can have the same or substantially the same filter bandpass characteristics. The acoustic wave filter device 1 can therefore reduce an insertion loss as compared with an acoustic wave filter device including only one of the longitudinally coupled acoustic wave resonators 10 and 20.

The electrode parameters of the IDT electrodes 11 to 15 included in the longitudinally coupled acoustic wave resonator 10 and the electrode parameters of the IDT electrodes 21 to 25 included in the longitudinally coupled acoustic wave resonator 20 may be equal or substantially equal. In this case, the filter bandpass characteristics of the longitudinally coupled acoustic wave resonators 10 and 20 connected in parallel with each other can be the same or substantially the same. Accordingly, an acoustic wave filter device according to the present preferred embodiment can more effectively reduce an insertion loss than an acoustic wave filter device including only one of the longitudinally coupled acoustic wave resonators 10 and 20.

Here, when the electrode parameters of the IDT electrodes 11 to 15 and the electrode parameters of 21 to 25 are equal or substantially equal, it does not mean that the electrode parameters of the respective IDT electrodes 11 to 15 and 21 to 25 are equal or substantially equal, and means that, for example, the electrode parameters of the IDT electrodes 11 and 21 are equal or substantially equal, the electrode parameters of the IDT electrodes 12 and 22 are equal or substantially equal, the electrode parameters of the IDT electrodes 13 and 23 are equal or substantially equal, the electrode parameters of the IDT electrodes 14 and 24 are equal or substantially equal, and the electrode parameters of the IDT electrodes 15 and 25 are equal or substantially equal. That is, the electrode parameters of the IDT electrodes 11 to 15 may differ from each other and the electrode parameters of the IDT electrodes 21 to 25 may differ from each other.

Figure 3A:
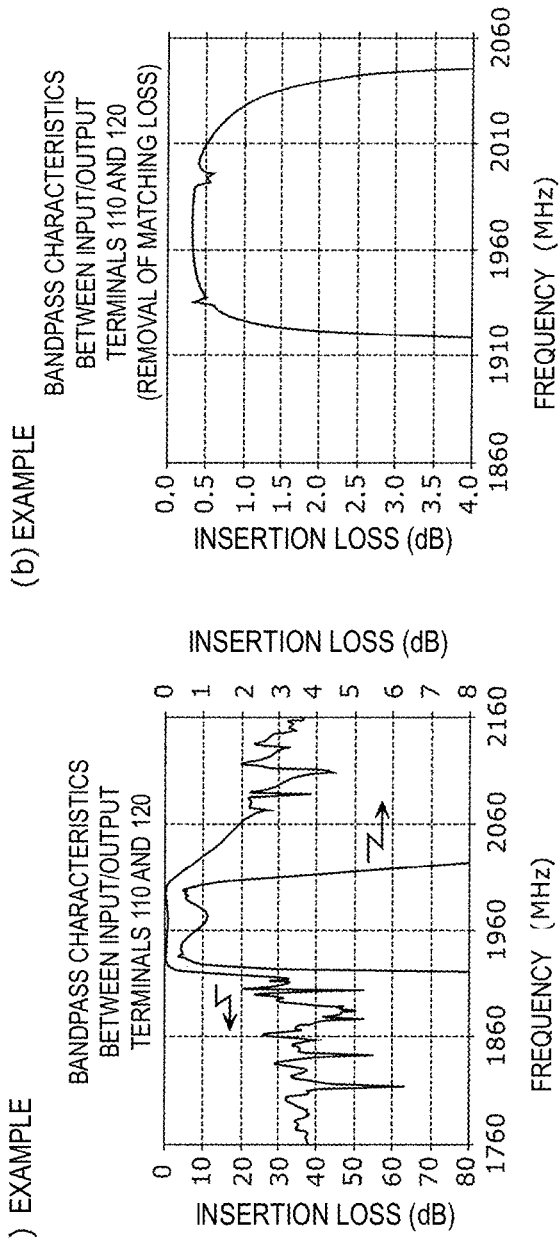
FIG. 3A is a graph representing the bandpass characteristics of an acoustic wave filter device according to an example of a preferred embodiment of the present invention.
Figure 3B:
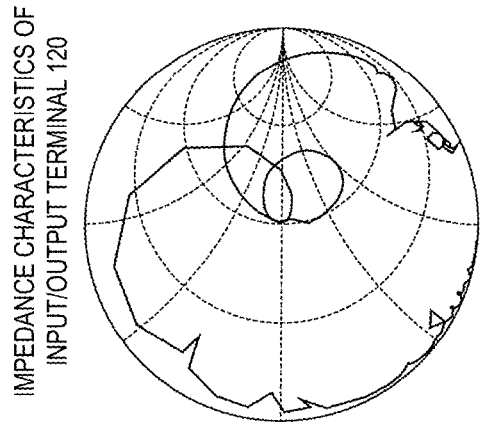
FIG. 3B is a Smith chart representing the impedance characteristics of an acoustic wave filter device according to an example of a preferred embodiment of the present invention.
Figure 3B:
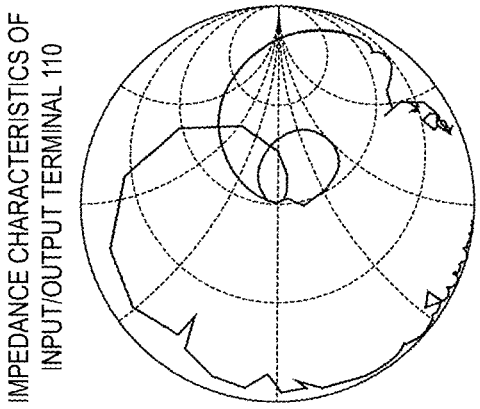

FIG. 3A is a graph representing the bandpass characteristics of the acoustic wave filter device 1 according to an example of a preferred embodiment of the present invention. FIG. 3B is a Smith chart representing the impedance characteristics of the acoustic wave filter device 1 according to an example of a preferred embodiment of the present invention. In the acoustic wave filter device 1 according to this example, the electrode parameters of the IDT electrodes 11 to 15 included in the longitudinally coupled acoustic wave resonator 10 and the electrode parameters of the IDT electrodes 21 to 25 included in the longitudinally coupled acoustic wave resonator 20 are equal or substantially equal.

As illustrated in FIG. 3B, in the acoustic wave filter device 1 according to the present example, part (a) illustrates an impedance when the acoustic wave filter device 1 is seen from the input/output terminal 110 and part (b) illustrates an impedance when the acoustic wave filter device 1 is seen from the input/output terminal 120 are equal or substantially equal. That is, the reflection coefficient of the acoustic wave filter device 1 at the input/output terminal 110 and the reflection coefficient of the acoustic wave filter device 1 at the input/output terminal 120 are equal or substantially equal.

Figure 4:
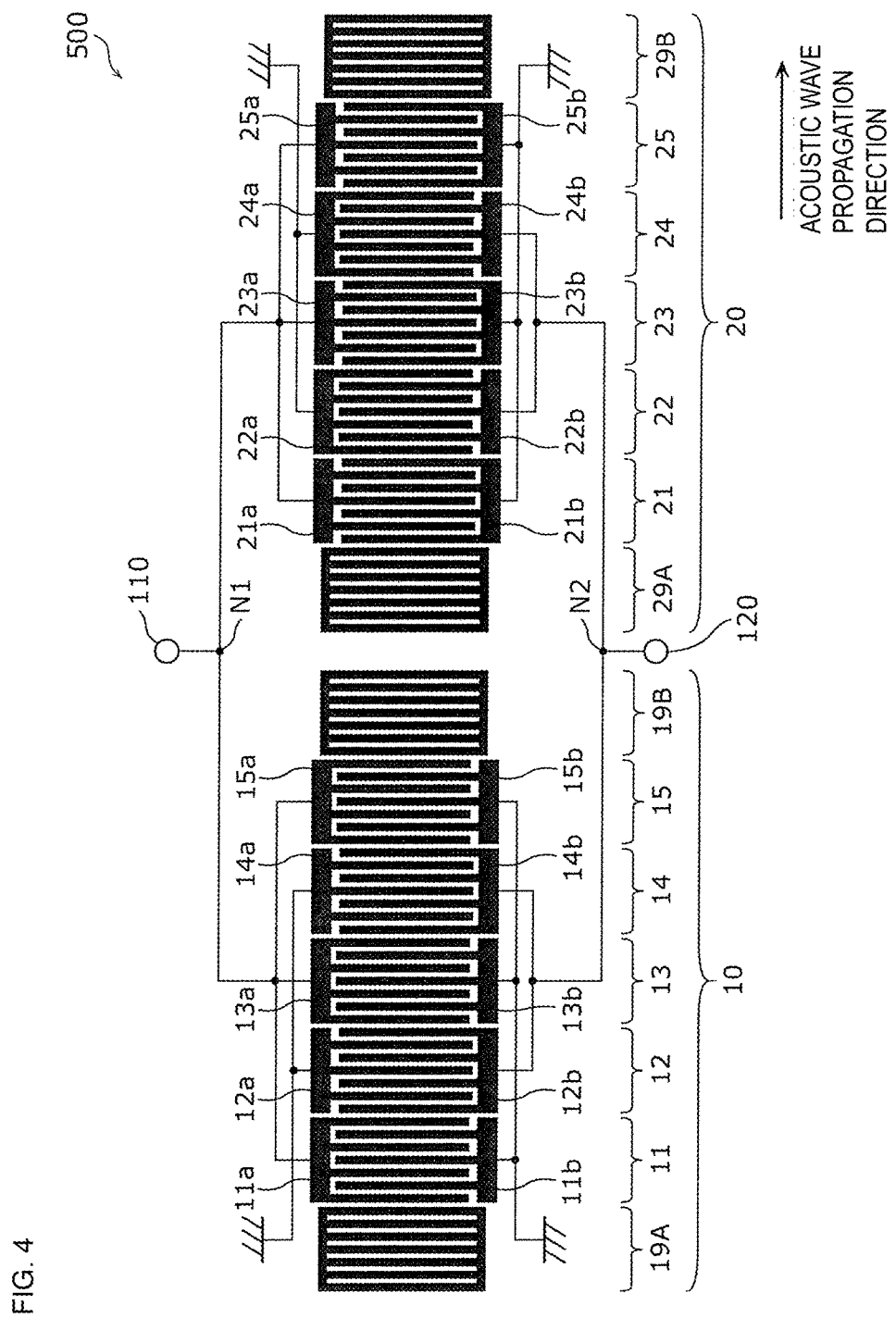
FIG. 4 is a diagram illustrating the circuit configuration of an acoustic wave filter device according to a comparative example.
Figure 5A:
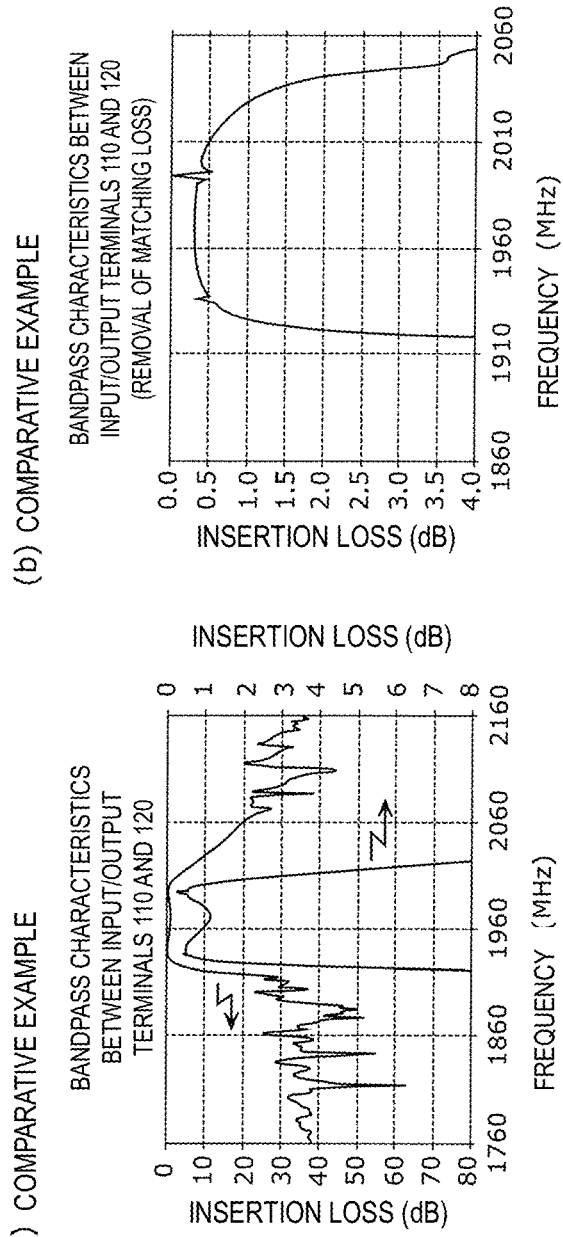
FIG. 5A is a graph representing the bandpass characteristics of an acoustic wave filter device according to a comparative example.
Figure 5B:
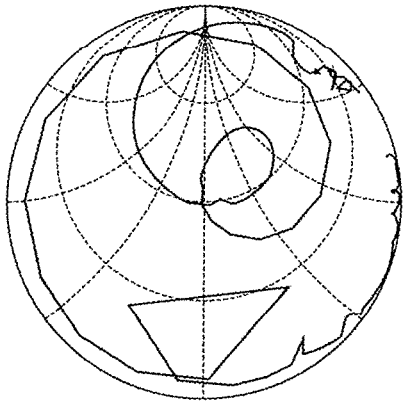
FIG. 5B is a Smith chart representing the impedance characteristics of an acoustic wave filter device according to a comparative example.
Figure 5B:
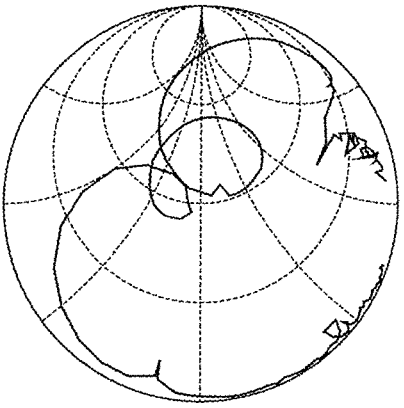

FIG. 4 is a diagram illustrating the circuit configuration of an acoustic wave filter device 500 according to a comparative example. FIG. 5A is a graph representing the bandpass characteristics of the acoustic wave filter device 500 according to a comparative example. FIG. 5B is a Smith chart representing the impedance characteristics of the acoustic wave filter device 500 according to a comparative example.

As illustrated in FIG. 4, the acoustic wave filter device 500 according to a comparative example includes the longitudinally coupled acoustic wave resonators 10 and 20 and the input/output terminals 110 and 120. The acoustic wave filter device 500 according to a comparative example differs from the acoustic wave filter device 1 according to an example of a preferred embodiment of the present invention in the connection configuration of the IDT electrodes in the longitudinally coupled acoustic wave resonators 10 and 20. The structure of the acoustic wave filter device 500 according to a comparative example different from that of the acoustic wave filter device 1 according to an example of a preferred embodiment of the present invention will be described below.

Among the IDT electrodes 11 to 15, one of the pair of comb-shaped electrodes included in each of the IDT electrodes 11, 13, and 15 disposed at odd-numbered positions in the acoustic wave propagation direction is connected to the node N1, and the other one of them is connected to the ground.

Among the IDT electrodes 11 to 15, one of the pair of comb-shaped electrodes included in each of the IDT electrodes 12 and 14 disposed at even-numbered positions in the acoustic wave propagation direction is connected to the ground, and the other one of them is connected to the node N2.

Among the IDT electrodes 21 to 25, one of the pair of comb-shaped electrodes included in each of the IDT electrodes 21, 23, and 25 disposed at odd-numbered positions in the acoustic wave propagation direction is connected to the node N1, and the other one of them is connected to the ground.

Among the IDT electrodes 21 to 25, one of the pair of comb-shaped electrodes included in each of the IDT electrodes 22 and 24 disposed at even-numbered positions in the acoustic wave propagation direction is connected to the node N2, and the other one of them is connected to the ground.

In the acoustic wave filter device 500 according to a comparative example, the sum (six) of the number of first IDT electrodes connected to the node N1 (the three IDT electrodes 11, 13, and 15) and the number of second IDT electrodes connected to the node N1 (the three IDT electrodes 21, 23, and 25) and the sum (four) of the number of first IDT electrodes connected to the node N2 (the two IDT electrodes 12 and 14) and the number of second IDT electrodes connected to the node N2 (the two IDT electrodes 22 and 24) are different.

In the acoustic wave filter device 500 according to a comparative example, the electrode parameters of the IDT electrodes 11 to 15 included in the longitudinally coupled acoustic wave resonator 10 and the electrode parameters of the IDT electrodes 21 to 25 included in the longitudinally coupled acoustic wave resonator 20 are equal or substantially equal.

As illustrated in FIG. 5A, the bandpass characteristics of the acoustic wave filter device 500 according to a comparative example are the same or substantially the same as those of the acoustic wave filter device 1 according to the example illustrated in FIG. 3A. However, it is apparent in FIG. 5B that (1) an impedance when the acoustic wave filter device 500 is seen from the input/output terminal 110 and (2) an impedance when the acoustic wave filter device 500 is seen from the input/output terminal 120 are significantly different from each other in both a passband and an attenuation band. That is, the reflection coefficient of the acoustic wave filter device 500 at the input/output terminal 110 and the reflection coefficient of the acoustic wave filter device 500 at the input/output terminal 120 are different. In this case, when the impedance matching between the acoustic wave filter device 500 and an external circuit connected to the input/output terminal 110 or 120 of the acoustic wave filter device 500 is performed, an impedance matching circuit needs to be changed based on which of the input/output terminal 110 and 120 is connected to the external circuit. Furthermore, in a multiplexer, impedance adjustment for another filter connected to a common terminal is limited.

Another comparative example is, for example, an acoustic wave filter device having a circuit configuration in which the two longitudinally coupled acoustic wave resonators 10 are reversed and connected in series. This configuration in which the two longitudinally coupled acoustic wave resonators 10 are connected in series can make an input impedance and an output impedance conform to each other, but causes a problem in that an insertion loss increases.

In contrast, the acoustic wave filter device 1 according to the present example having circuit configuration in which the two longitudinally coupled acoustic wave resonators 10 and 20 are connected in parallel improves an insertion loss. Since the number of IDT electrodes connected to the input/output terminal 110 (for example, five) and the number of IDT electrodes connected to the input/output terminal 120 (for example, five) are the same, the difference between an impedance seen by the input/output terminal 110 of the acoustic wave filter device 1 and an impedance seen by the input/output terminal 120 of the acoustic wave filter device 1 can be reduced. Accordingly, regardless of whether an external circuit is connected to the input/output terminal 110 or 120 of the acoustic wave filter device 1, the impedance matching with the external circuit can be adjusted. In addition, in a multiplexer, the degree of flexibility in impedance adjustment for another filter connected to a common terminal is increased.

1-2. Impedance Adjustment of the Acoustic Wave Filter Device 1

The description of why an acoustic wave filter device 1 according to a preferred embodiment can increase the degree of flexibility in impedance adjustment will be provided. The acoustic wave filter device 1 according to an example of a preferred embodiment has a passband of about 1905 MHz to about 1990 MHz and an attenuation band of about 2300 MHz to about 2700 MHz. The suitability of impedance adjustment in the passband and the attenuation band will be described while the acoustic wave filter device 1 according to the present example and the acoustic wave filter device 500 according to a comparative example are compared.

Figure 6A:
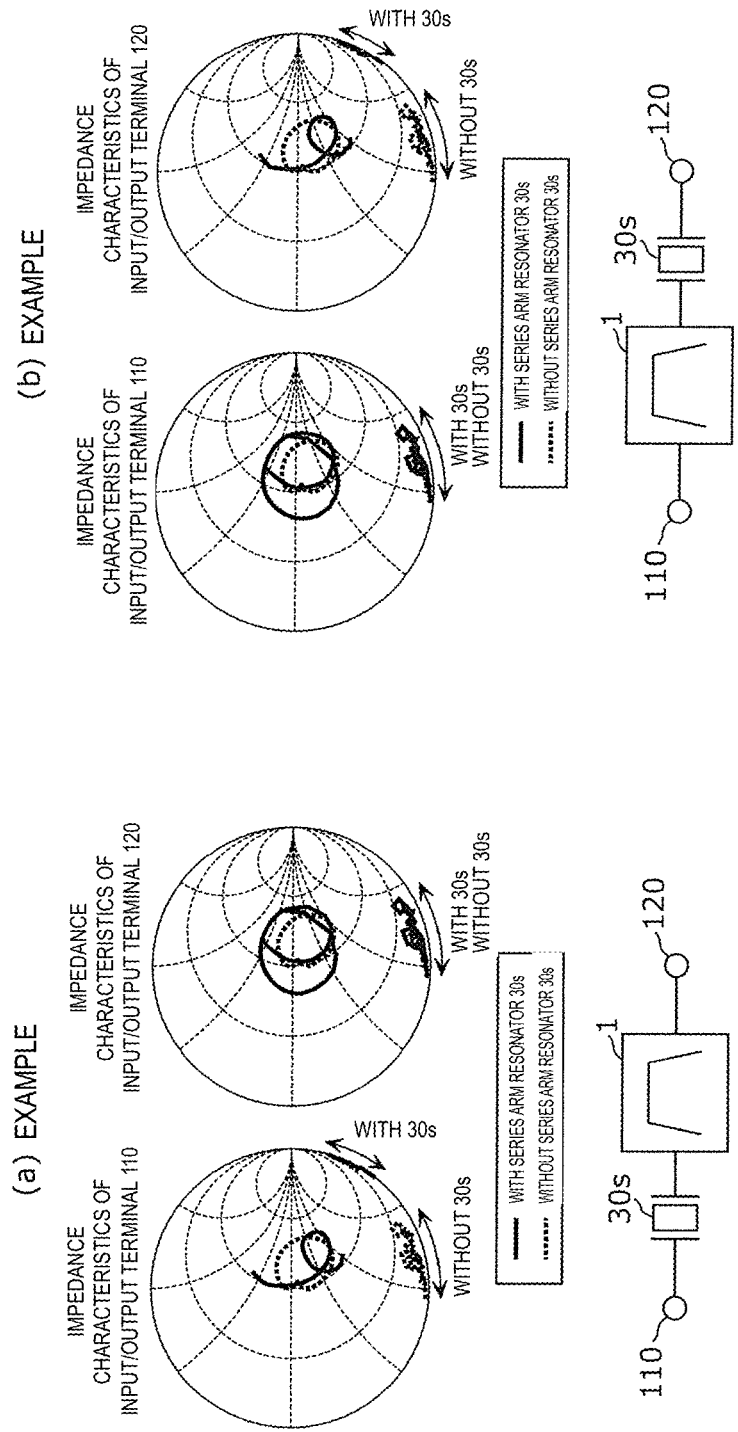
FIG. 6A is a Smith chart representing the impedance characteristics of an acoustic wave filter device according to an example of a preferred embodiment of the present invention in which a series arm resonator is added.

FIG. 6A is a Smith chart representing the impedance characteristics of the acoustic wave filter device 1 according to the present example in which a series arm resonator 30s is added. Part (a) of FIG. 6A illustrates input/output-terminal-110-side impedance characteristics and input/output-terminal-120-side impedance characteristics when the series arm resonator 30s is added on the input/output-terminal-110 side. Part (b) of FIG. 6A illustrates input/output-terminal-110-side impedance characteristics and input/output-terminal-120-side impedance characteristics when the series arm resonator 30s is added on the input/output-terminal-120 side. Referring to FIG. 6A, impedance data located near the center point of the Smith chart is data in the passband (about 1905 MHz to about 1990 MHz) and impedance data located near the outer circumference of the Smith chart is data in the attenuation band (about 2300 MHz to about 2700 MHz).

As illustrated in parts (a) and (b) OF FIG. 6A, the input/output-terminal-110-side impedance and the input/output-terminal-120-side impedance are equal or substantially equal in a state where the series arm resonator 30s is not added (broken lines in FIG. 6A). When the series arm resonator 30s is added, the impedance in the attenuation band is subjected to the phase shift of approximately 30° to the open side on the side where the series arm resonator 30s is added (the input/output-terminal-110 side in part (a) of FIG. 6A and the input/output-terminal-120 side in part (b) of FIG. 6A) without a reduction in a reflection coefficient. On the other hand, on the side where the series arm resonator 30s is not added (the input/output-terminal-120 side in part (a) of FIG. 6A and the input/output-terminal-110 side in part (b) of FIG. 6A), the deterioration level of the degree of concentration (of a spiral) of the impedance in the passband is low.

As is apparent from FIG. 6A, regardless of whether the series arm resonator 30s is added on the input/output-terminal-110 side or the input/output-terminal-120 side in the acoustic wave filter device 1, the impedance in the attenuation band can be phase-shifted to the open side without the deterioration of the impedance in the passband.

Figure 6B:
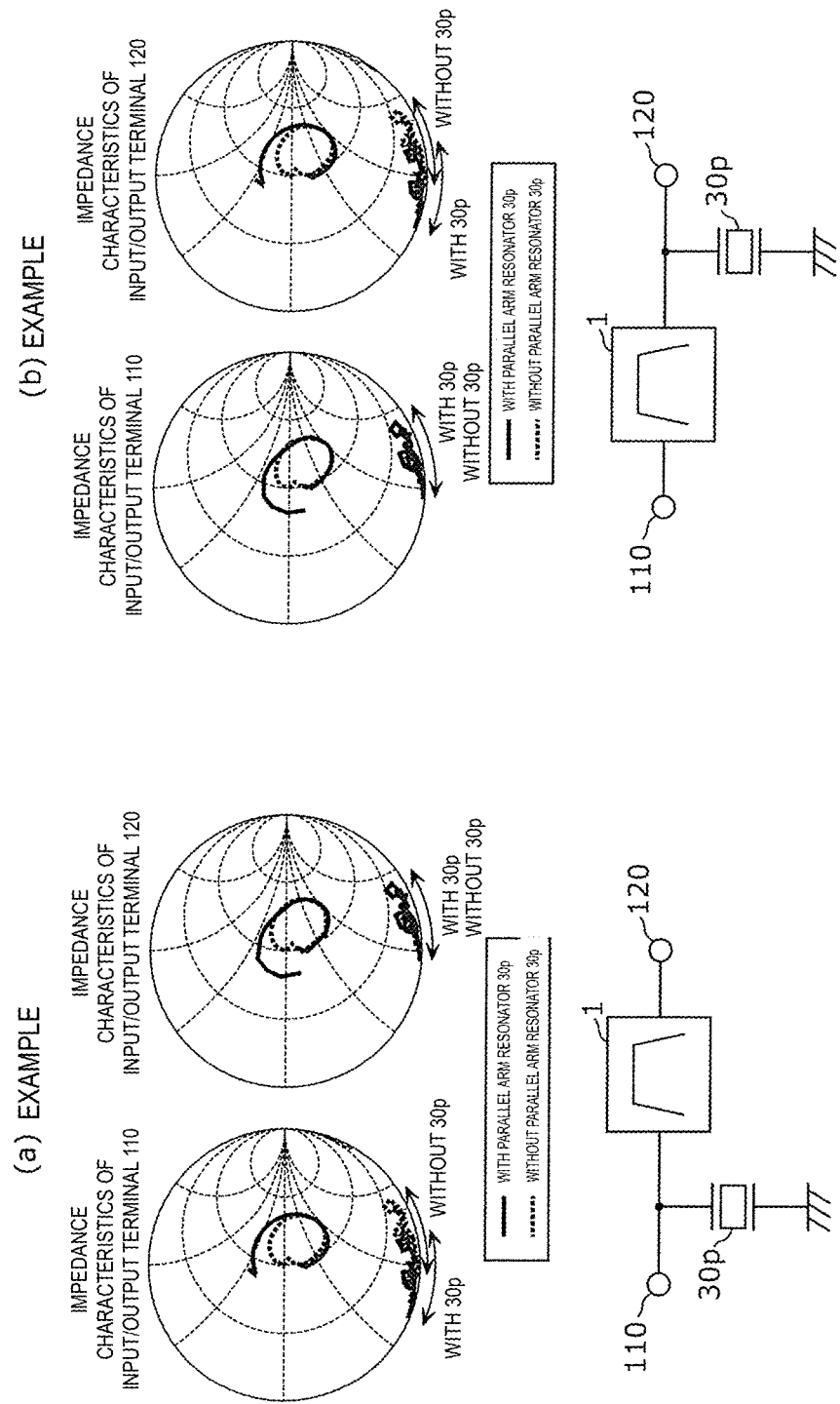
FIG. 6B is a Smith chart representing the impedance characteristics of an acoustic wave filter device according to an example of a preferred embodiment of the present invention in which a parallel arm resonator is added.

FIG. 6B is a Smith chart representing the impedance characteristics of the acoustic wave filter device 1 according to an example of a preferred embodiment of the present invention in which a parallel arm resonator 30p is added. Part (a) of FIG. 6B illustrates the input/output-terminal-110-side impedance characteristics and input/output-terminal-120-side impedance characteristics of the acoustic wave filter device 1 in which the parallel arm resonator 30p is added on the input/output-terminal-110 side. Part (b) of FIG. 6B illustrates the input/output-terminal-110-side impedance characteristics and input/output-terminal-120-side impedance characteristics of the acoustic wave filter device 1 in which the parallel arm resonator 30p is added on the input/output-terminal-120 side. Referring to FIG. 6B, impedance data located near the center point of the Smith chart is data in the passband (about 1905 MHz to about 1990 MHz) and impedance data located near the outer circumference of the Smith chart is data in the attenuation band (about 2300 MHz to about 2700 MHz).

As illustrated in parts (a) and (b) of FIG. 6B, an input/output-terminal-110-side impedance and an input/output-terminal-120-side impedance are equal or substantially equal in a state where the parallel arm resonator 30p is not added (broken lines in FIG. 6B). When the parallel arm resonator 30p is added, the impedance in the attenuation band is subjected to the phase shift of approximately 10° to the short side on the side where the parallel arm resonator 30p is added (the input/output-terminal-110 side in part (a) of FIG. 6B and the input/output-terminal-120 side in part (b) of FIG. 6B) without the reduction in a reflection coefficient. On the other hand, on the side where the parallel arm resonator 30p is not added (the input/output-terminal-120 side in part (a) of FIG. 6B and the input/output-terminal-110 side in part (b) of FIG. 6B), the deterioration level of the degree of concentration (of a spiral) of the impedance in the passband is low.

As is apparent from FIG. 6B, regardless of whether the parallel arm resonator 30p is added on the input/output-terminal-110 side or the input/output-terminal-120 side in the acoustic wave filter device 1, the impedance in the attenuation band can be phase-shifted to the short side without the deterioration of the impedance in the passband.

Figure 7A:
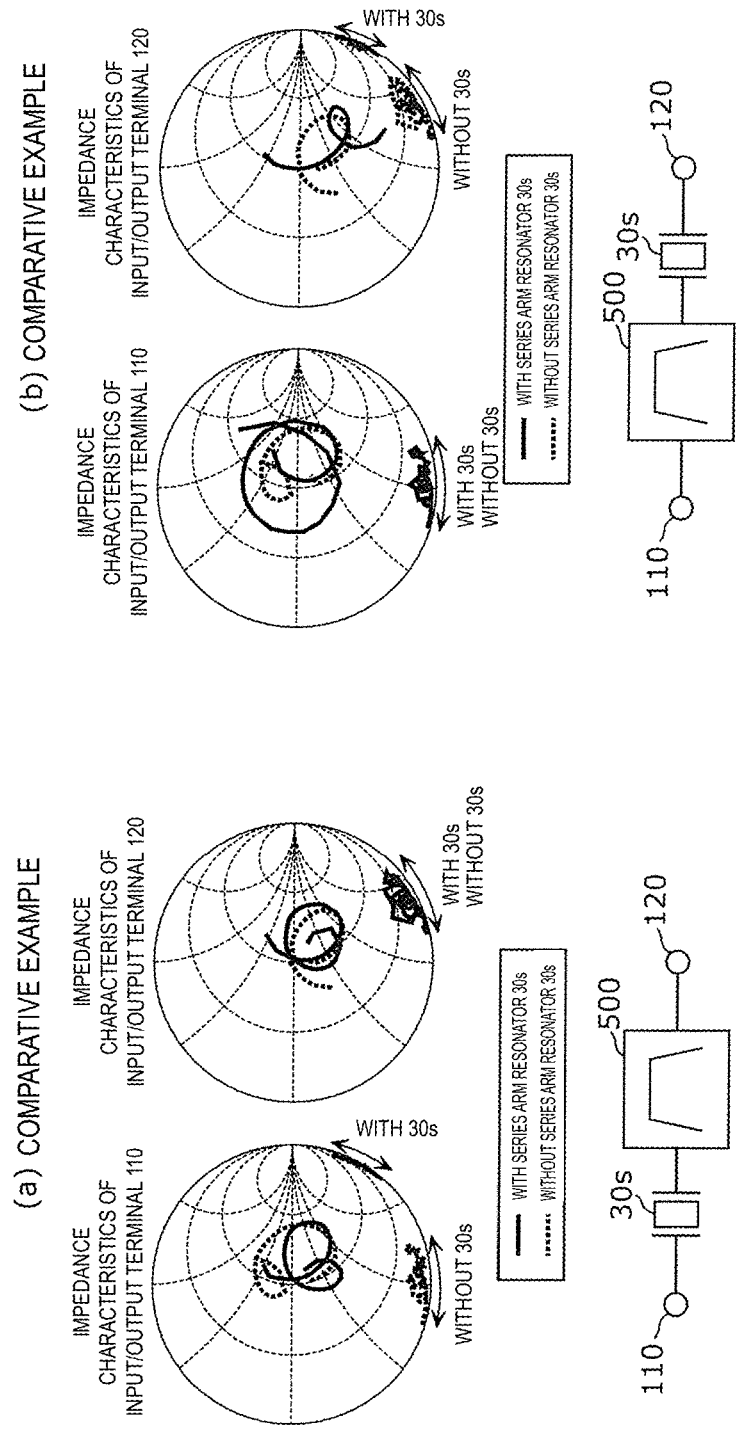
FIG. 7A is a Smith chart representing the impedance characteristics of an acoustic wave filter device according to a comparative example in which a series arm resonator is added.

FIG. 7A is a Smith chart representing the impedance characteristics of the acoustic wave filter device 500 according to a comparative example in which the series arm resonator 30s is added. Part (a) of FIG. 7A illustrates the input/output-terminal-110-side impedance characteristics and the input/output-terminal-120-side impedance characteristics when the series arm resonator 30s is added on the input/output-terminal-110 side in the acoustic wave filter device 500. Part (a) of FIG. 7A illustrates the input/output-terminal-110-side impedance characteristics and the input/output-terminal-120-side impedance characteristics when the series arm resonator 30s is added on the input/output-terminal-120 side in the acoustic wave filter device 500. Referring to FIG. 7A, impedance data located near the center point of the Smith chart is data in the passband (about 1905 MHz to about 1990 MHz) and impedance data located near the outer circumference of the Smith chart is data in the attenuation band (about 2300 MHz to about 2700 MHz).

As illustrated in parts (a) and (b) of FIG. 7A, the input/output-terminal-110-side impedance in the passband and the input/output-terminal-120-side impedance in the passband are different in a state where the series arm resonator 30s is not added (broken lines in FIG. 7A), and, in particular, the input/output-terminal-120-side impedance in the passband is capacitive. On the other hand, the input/output-terminal-110-side impedance in the attenuation band and the input/output-terminal-120-side impedance in the attenuation band are equal or substantially equal.

When the series arm resonator 30s is added on the input/output-terminal-110 side as illustrated in part (a) of FIG. 7A, the impedance in the attenuation band is subjected to the phase shift of approximately 30° to the open side without the reduction in a reflection coefficient on the input/output terminal-110 side and the deterioration level of the degree of concentration of the impedance in the passband is low on the input/output-terminal-120 side. On the other hand, when the series arm resonator 30s is added on the input/output-terminal-120 side as illustrated in part (b) of FIG. 7A, the impedance in the attenuation band is subjected to the phase shift of approximately 30° to the open side without the reduction in a reflection coefficient on the input/output-terminal-120 side. However, the deterioration level of the degree of concentration (of a spiral) of the impedance in the passband becomes high on the input/output-terminal-110 side, because the input/output-terminal-120 side impedance in the passband becomes capacitive.

As is apparent from FIG. 7A, the input/output-terminal-110-side impedance in the passband is deteriorated when the series arm resonator 30s is added on the input/output-terminal-120 side in the acoustic wave filter device 500.

Figure 7B:
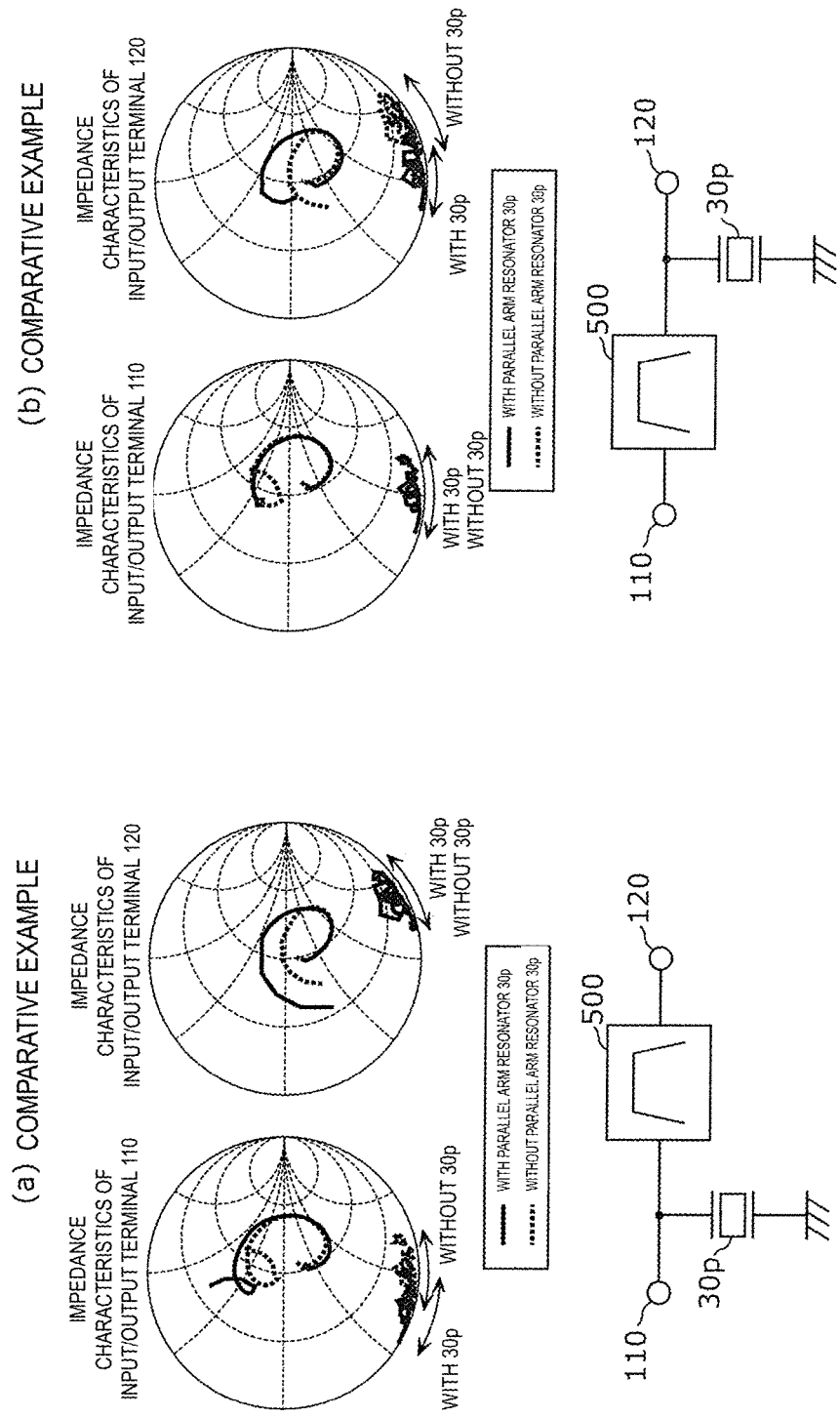
FIG. 7B is a Smith chart representing the impedance characteristics of an acoustic wave filter device according to a comparative example in which a parallel arm resonator is added.

FIG. 7B is a Smith chart representing the impedance characteristics of the acoustic wave filter device 500 according to a comparative example in which a parallel arm resonator 30p is added. Part (a) of FIG. 7B illustrates the input/output-terminal-110-side impedance characteristics and the input/output-terminal-120-side impedance characteristics when the parallel arm resonator 30p is added on the input/output-terminal-110 side in the acoustic wave filter device 500. Part (b) of FIG. 7B illustrates the input/output-terminal-110-side impedance characteristics and the input/output-terminal-120-side impedance characteristics when the parallel arm resonator 30p is added on the input/output-terminal-120 side in the acoustic wave filter device 500. Referring to FIG. 7B, impedance data located near the center point of the Smith chart is data in the passband (about 1905 MHz to about 1990 MHz) and impedance data located near the outer circumference of the Smith chart is data in the attenuation band (about 2300 MHz to about 2700 MHz).

When the parallel arm resonator 30p is added on the input/output-terminal-110 side as illustrated in part (a) of FIG. 7B, the impedance in the attenuation band is subjected to the phase shift of approximately 10° to the short side without the reduction in a reflection coefficient but the deterioration level of the degree of concentration (of a spiral) of the impedance in the passband is large on the input/output-terminal-110 side. On the other hand, when the parallel arm resonator 30p is added on the input/output-terminal-120 side as illustrated in part (b) of FIG. 7B, the impedance in the attenuation band is subjected to the phase shift of approximately 10° to the short side without the reduction in a reflection coefficient and the deterioration level of the degree of concentration (of a spiral) of the impedance in the passband is low on the input/output-terminal-120 side.

As is apparent from FIG. 7B, the input/output-terminal-110-side impedance in the passband is deteriorated when the parallel arm resonator 30p is added on the input/output-terminal-110 side in the acoustic wave filter device 500.

As described above, in order to perform impedance adjustment without deterioration of characteristics in the acoustic wave filter device 500 according to a comparative example, among the series arm resonator 30s and the parallel arm resonator 30p, only the series arm resonator 30s can be added on the input/output-terminal-110 side and only the parallel arm resonator 30p can be added on the input/output-terminal-120 side. That is, in the acoustic wave filter device 500 according to a comparative example, the degree of flexibility in impedance adjustment is limited because of the difference between the input/output-terminal-110-side impedance and the input/output-terminal-120-side impedance.

In contrast, in order to perform impedance adjustment without deterioration of characteristics in the acoustic wave filter device 1 according to an example of a preferred embodiment of the present invention, either of the series arm resonator 30s and the parallel arm resonator 30p can be added on both the input/output-terminal-110 side and the input/output-terminal-120 side. That is, the acoustic wave filter device 1 according to the present preferred embodiment may further include the series arm resonator 30s disposed on at least one of a path connecting the input/output terminal 110 and the node N1 and a path connecting the input/output terminal 120 and the node N2. The acoustic wave filter device 1 according to the present preferred embodiment may further include the parallel arm resonator 30p disposed at at least one of a position between the ground and a node on the path connecting the input/output terminal 110 and the node N1 and a position between the ground and a node on the path connecting the input/output terminal 120 and the node N2.

As a result, the degree of flexibility in impedance adjustment is increased, because a node-N1-side impedance and a node-N2-side impedance in a circuit in which the longitudinally coupled acoustic wave resonators 10 and the 20 are connected in parallel are equal or substantially equal.

1-3. Structure of Acoustic Wave Filter Device 2 According to Modification of First Preferred Embodiment The acoustic wave filter device 1 according to the present preferred embodiment has a structure in which the number of first IDT electrodes included in the first longitudinally coupled acoustic wave resonator and the number of second IDT electrodes included in the second longitudinally coupled acoustic wave resonator are the same. The acoustic wave filter device 2 according to a modification of the first preferred embodiment has a structure in which the number of first IDT electrodes included in the first longitudinally coupled acoustic wave resonator and the number of second IDT electrodes included in the second longitudinally coupled acoustic wave resonator are different. In the following, the description of similarities in structure between the acoustic wave filter device 2 according to the present modification and the acoustic wave filter device 1 according to the first preferred embodiment is omitted, and differences in structure therebetween are mainly described.

Figure 8:
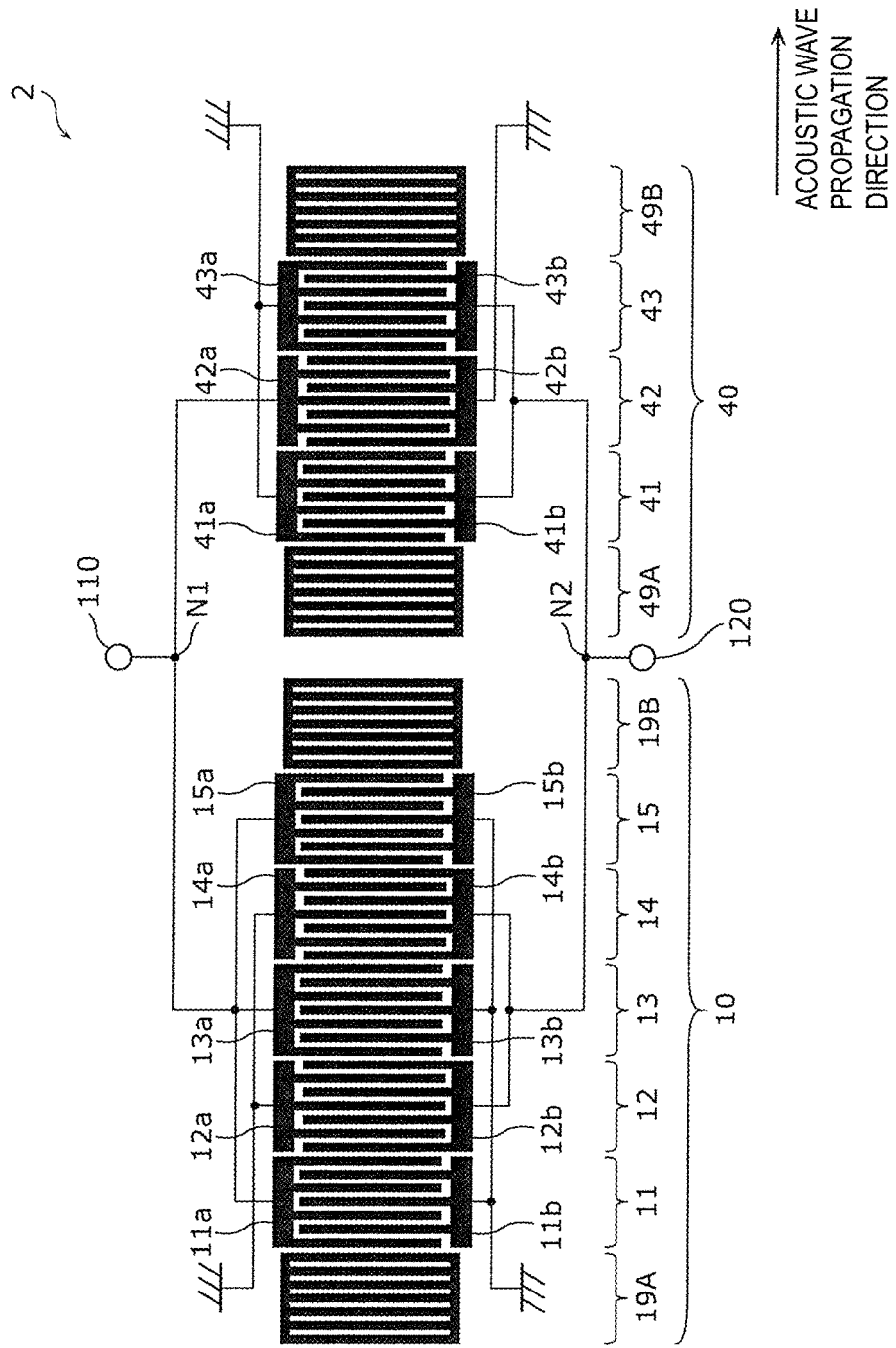
FIG. 8 is a diagram illustrating the circuit configuration of an acoustic wave filter device according to a modification of the first preferred embodiment of the present invention.

FIG. 8 is a diagram illustrating the circuit configuration of the acoustic wave filter device 2 according to a modification of the first preferred embodiment. The acoustic wave filter device 2 according to the present modification includes the longitudinally coupled acoustic wave resonator 10, a longitudinally coupled acoustic wave resonator 40, and the input/output terminals 110 and 120.

The longitudinally coupled acoustic wave resonator 10 is an example of the first longitudinally coupled acoustic wave resonator and includes the five IDT electrodes 11, 12, 13, 14, and 15 and the reflectors 19A and 19B. The longitudinally coupled acoustic wave resonator 40 is an example of the second longitudinally coupled acoustic wave resonator and includes three IDT electrodes 41, 42, and 43 and reflectors 49A and 49B. The IDT electrodes 11 to 15 are an odd number of first IDT electrodes arranged in an acoustic wave propagation direction. The IDT electrodes 41 to 43 are an odd number of second IDT electrodes arranged in the acoustic wave propagation direction. The number of IDT electrodes included in the longitudinally coupled acoustic wave resonator 10 does not necessarily have to be five and may be any odd number. The number of IDT electrodes included in the longitudinally coupled acoustic wave resonator 40 does not necessarily have to be three and may be any odd number.

The reflectors 19A and 19B sandwich the IDT electrodes to 15 in the acoustic wave propagation direction. The reflectors 49A and 49B sandwich the IDT electrodes 41 to 43 in the acoustic wave propagation direction. The longitudinally coupled acoustic wave resonator 10 does not have to include the reflectors 19A and 19B. The longitudinally coupled acoustic wave resonator 40 does not have to include the reflectors 49A and 49B.

The IDT electrodes 11 to 15 and 41 to 43 and the reflectors 19A, 19B, 49A, and 49B are provided on a substrate having piezoelectricity. As described with reference to FIG. 2A, each of the IDT electrodes 11 to 15 and 41 to 43 includes a pair of comb-shaped electrodes each including a busbar electrode extending in the acoustic wave propagation direction and multiple electrode fingers that are connected to the busbar electrode and extend in a direction crossing the acoustic wave propagation direction.

Among the IDT electrodes 11 to 15, the IDT electrodes 11, 13, and 15 are disposed at odd-numbered positions from the outermost end portion (for example, the reflector 19A) of the longitudinally coupled acoustic wave resonator 10 in the acoustic wave propagation direction. One (the busbar electrodes 11a, 13a, and 15a) of the pair of comb-shaped electrodes included in each of the IDT electrodes 11, 13, and 15 is connected to the node N1 (first node), and the other one (the busbar electrodes 11b, 13b, and 15b) of them is connected to the ground.

Among the IDT electrodes 11 to 15, the IDT electrodes 12 and 14 are disposed at even-numbered positions from the outermost end portion (for example, the reflector 19A) of the longitudinally coupled acoustic wave resonator 10 in the acoustic wave propagation direction. One (busbar electrodes 12a and 14a) of the pair of comb-shaped electrodes included in each of the IDT electrodes 12 and 14 is connected to the ground, and the other one (busbar electrodes 12b and 14b) of them is connected to the node N2 (second node) different from the node N1.

Among the IDT electrodes 41 to 43, the IDT electrodes 41 and 43 are disposed at odd-numbered positions from the outermost end portion (for example, the reflector 49A) of the longitudinally coupled acoustic wave resonator 40 in the acoustic wave propagation direction. One (busbar electrodes 41a and 43a) of the pair of comb-shaped electrodes included in each of the IDT electrodes 41 and 43 is connected to the ground, and the other one (busbar electrodes 41b and 43b) of them is connected to the node N2.

Among the IDT electrodes 41 to 43, the IDT electrode 42 is disposed at an even-numbered position from the outermost end portion (for example, the reflector 49A) of the longitudinally coupled acoustic wave resonator 40 in the acoustic wave propagation direction. One (a busbar electrode 42a) of the pair of comb-shaped electrodes included in the IDT electrode 42 is connected to the node N1, and the other one (a busbar electrode 42b) of them is connected to the ground.

The longitudinally coupled acoustic wave resonator 10 having the above structure defines and functions as a bandpass filter having a first passband. The longitudinally coupled acoustic wave resonator 40 defines and functions as a bandpass filter having a second passband.

In the acoustic wave filter device 2 according to the present modification, the sum (four) of the number of first IDT electrodes connected to the node N1 (the three IDT electrodes 11, 13, and 15) and the number of second IDT electrodes connected to the node N1 (the one IDT electrode 42) and the sum (four) of the number of first IDT electrodes connected to the node N2 (the two IDT electrodes 12 and 14) and the number of second IDT electrodes connected to the node N2 (the two IDT electrodes 41 and 43) are the same.

In the acoustic wave filter device 2 according to the present modification in which the number of IDT electrodes connected to the input/output terminal 110 (for example, four) and the number of IDT electrodes connected to the input/output terminal 120 (for example, four) are the same, the difference between an impedance seen by the input/output terminal 110 of the acoustic wave filter device 2 and an impedance seen by the input/output terminal 120 of the acoustic wave filter device 2 can be reduced. Accordingly, regardless of whether an external circuit is connected to the input/output terminal 110 or 120 of the acoustic wave filter device 2, the impedance matching with the external circuit can be adjusted. In addition, in a multiplexer, the degree of flexibility in impedance adjustment for another filter connected to a common terminal is increased.

Second Preferred Embodiment

The structure of a multiplexer including the acoustic wave filter device 1 according to the first preferred embodiment will be described in a second preferred embodiment of the present invention.

In the case of a multiplexer in which multiple filters are connected to a common terminal, a common-terminal-side impedance of one of the multiple filters in the attenuation band (the passbands of the other filters) should have a phase determined based on the combined impedance of the multiplexer. It is therefore preferable that, regardless of whether any one of two input/output terminals of the one filter is connected to the common terminal, the degree of concentration (of a spiral) of the impedance in the band thereof (the passband of the one filter) is not deteriorated and an impedance in the attenuation band (the passbands of the other filters) is freely subjected to a phase shift.

Figure 9A:
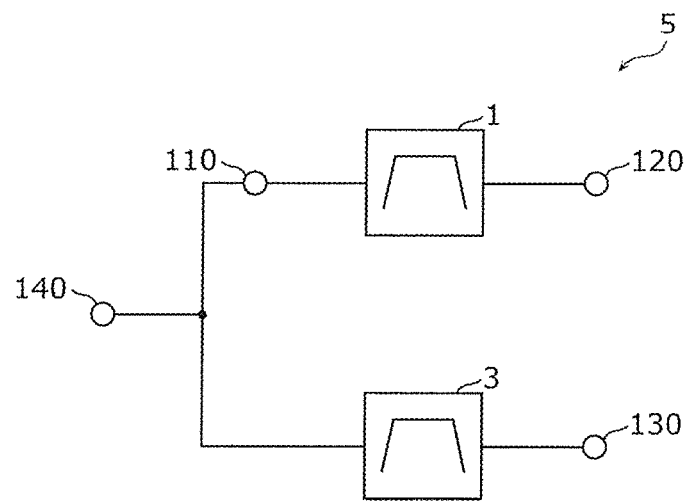
FIG. 9A is a diagram illustrating the circuit configuration of a multiplexer according to a second preferred embodiment of the present invention.

FIG. 9A is a diagram illustrating the circuit configuration of a multiplexer 5 according to the second preferred embodiment. As illustrated in FIG. 9A, the multiplexer 5 according to the present preferred embodiment includes a common terminal 140, the input/output terminals 120 and 130, the acoustic wave filter device 1, and a filter 3.

The acoustic wave filter device 1 according to the first preferred embodiment is disposed on a first path connecting the common terminal 140 and the input/output terminal 120 (first terminal). Any one of the nodes N1 and N2 of the acoustic wave filter device 1 may be connected to the common terminal 140.

The filter 3 has a passband different from the passband of the acoustic wave filter device 1 and is disposed on a second path connecting the common terminal 140 and an input/output terminal 130 (second terminal). The filter 3 may be, for example, a surface acoustic wave filter, an acoustic wave filter that uses BAWs, an LC resonant filter, a dielectric filter, an LC filter, or the like and have an optional filter structure.

With the above structure of the multiplexer 5 according to the present preferred embodiment, an impedance seen by the input/output terminal 110 of the acoustic wave filter device 1 and an impedance seen by the input/output terminal 120 of the acoustic wave filter device 1 can be made the same or substantially the same. Accordingly, in order to improve or optimize the filter characteristics of the acoustic wave filter device 1 and the filter 3, a series arm resonator and a parallel arm resonator can be freely added on the common-terminal-140 side in the acoustic wave filter device 1. As a result, a multiplexer can be provided with which the degree of flexibility in impedance adjustment is improved.

Figure 9B:
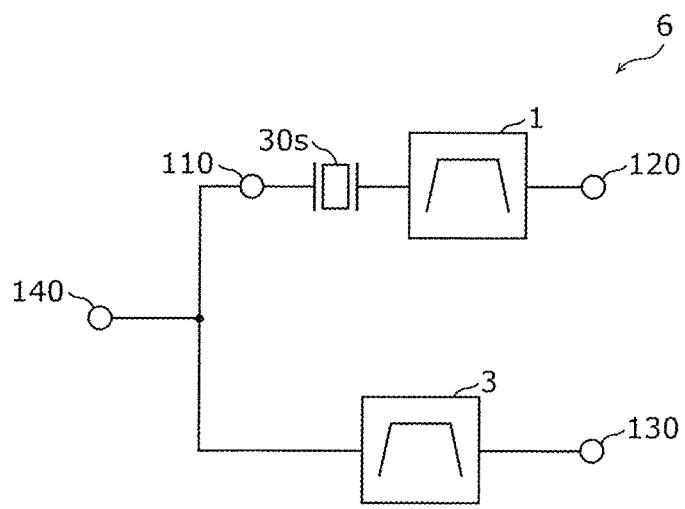
FIG. 9B is a diagram illustrating the circuit configuration of a multiplexer according to a first modification of the second preferred embodiment of the present invention.

FIG. 9B is a diagram illustrating the circuit configuration of a multiplexer 6 according to a first modification of the second preferred embodiment. As illustrated in FIG. 9B, the multiplexer 6 according to the present modification includes the series arm resonator 30s on the common-terminal-140 side in the acoustic wave filter device 1, in addition to the components in the multiplexer 5 according to the second preferred embodiment. With this structure, an impedance in the attenuation band (the passband of the filter 3) can be shifted to the open side without the deterioration of the degree of concentration (of a spiral) of an impedance in the passband of the acoustic wave filter device 1 and the reduction in a reflection coefficient. Accordingly, the filter characteristics of the acoustic wave filter device 1 and the filter 3 can be improved, and the bandpass characteristics of the multiplexer 6 can be improved.

In the multiplexer 6 according to the present modification, a parallel arm resonator may be further added on the common-terminal-140 side in the acoustic wave filter device 1 and at least one of a series arm resonator and a parallel arm resonator may be added on the input/output-terminal-120 side in the acoustic wave filter device 1.

Figure 9C:
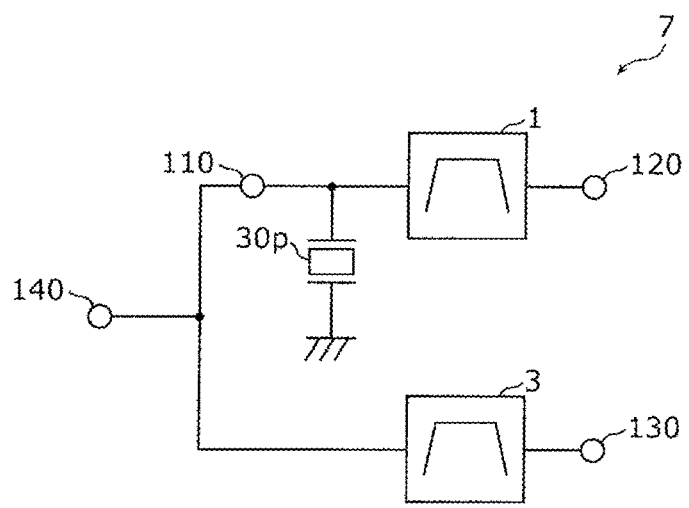
FIG. 9C is a diagram illustrating the circuit configuration of a multiplexer according to a second modification of the second preferred embodiment of the present invention.

FIG. 9C is a diagram illustrating the circuit configuration of a multiplexer 7 according to a second modification of the second preferred embodiment. As illustrated in FIG. 9C, the multiplexer 7 according to the present modification includes the parallel arm resonator 30p on the common-terminal-140 side in the acoustic wave filter device 1 in addition to the components in the multiplexer 5 according to the second preferred embodiment. With this structure, an impedance in the attenuation band (the passband of the filter 3) can be shifted to the short side without the deterioration of the degree of concentration (of a spiral) of an impedance in the passband of the acoustic wave filter device 1 and the reduction in a reflection coefficient. Accordingly, the filter characteristics of the acoustic wave filter device 1 and the filter 3 can be improved, and the bandpass characteristics of the multiplexer 7 can be improved.

In the multiplexer 7 according to this modification, a series arm resonator may be further added on the common-terminal-140 side in the acoustic wave filter device 1 and at least one of a series arm resonator and a parallel arm resonator may be added on the input/output-terminal-120 side in the acoustic wave filter device 1.

In the above-described multiplexers 5, 6, and 7, the number of filters connected to the common terminal 140 is not limited two and may be three or more.

OTHER PREFERRED EMBODIMENTS

Acoustic wave filter devices according to preferred embodiments of the present invention and multiplexers according to preferred embodiments of the present invention have been described with reference to the first and second preferred embodiments and the modifications of the first and second preferred embodiments, but are not limited to the above-described preferred embodiments and the above-described modifications. The present invention also includes other preferred embodiments provided by combining optional elements of the above-described preferred embodiments and the above-described modifications, modifications obtained by making various changes, which are conceived by those skilled in the art, to the above-described preferred embodiments and the above-described modifications without departing from the spirit and scope of the present invention, and various apparatuses including an acoustic wave filter device according to the above-described preferred embodiments and the above-described modifications and multiplexers according to the above-described preferred embodiments and the above modifications.

For example, in acoustic wave filter devices according to the above-described preferred embodiments and the modifications of the above-described preferred embodiments and multiplexers according to the above-described preferred embodiments and the modifications of the above-described preferred embodiments, other circuit elements and other wiring lines may be included between the illustrated circuit elements (and components) and between the illustrated paths each connecting signal paths.

Preferred embodiments of the present invention can be widely used as transmission and reception filters and multiplexers for use in front-ends of wireless communication terminals for which low loss in a passband and high attenuation outside the passband are required.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave filter device comprising:
   a first longitudinally coupled acoustic wave resonator including an odd number, greater than one, of first interdigital transducer (IDT) electrodes arranged in an acoustic wave propagation direction;

a second longitudinally coupled acoustic wave resonator including an odd number, greater than one, of second IDT electrodes arranged in the acoustic wave propagation direction;
a first node and a second node different from the first node; and
a first input/output terminal connected to the first node and a second input/output terminal connected to the second node; wherein
each of the odd number of first IDT electrodes and the odd number of second IDT electrodes includes a pair of comb-shaped electrodes each including a busbar electrode and a plurality of electrode fingers connected to the busbar electrode and extending in a direction crossing the acoustic wave propagation direction;
one of the pair of comb-shaped electrodes included in each of an odd-numbered first IDT electrodes in the acoustic wave propagation direction among the odd number of first IDT electrodes is connected to the first node and another one of the pair of comb-shaped electrodes is connected to a ground;
one of the pair of comb-shaped electrodes included in each of the even-numbered first IDT electrodes in the acoustic wave propagation direction among the odd number of first IDT electrodes is connected to the ground and another one of the pair of comb-shaped electrodes is connected to the second node;
one of the pair of comb-shaped electrodes included in each of the odd-numbered second IDT electrodes in the acoustic wave propagation direction among the odd number of second IDT electrodes is connected to the ground and another one of the pair of comb-shaped electrodes is connected to the second node;
one of the pair of comb-shaped electrodes included in each of the even-numbered second IDT electrodes in the acoustic wave propagation direction among the odd number of second IDT electrodes is connected to the first node and another one of the pair of comb-shaped electrodes is connected to the ground; and
a sum of the number of first IDT electrodes connected to the first node and the number of second IDT electrodes connected to the first node and a sum of the number of first IDT electrodes connected to the second node and the number of second IDT electrodes connected to the second node are equal.

2. The acoustic wave filter device according to claim 1, wherein the odd number of first IDT electrodes and the odd number of second IDT electrodes are equal in number.

3. The acoustic wave filter device according to claim 2, wherein an electrode parameter of an n-th first IDT electrode in the acoustic wave propagation direction among the odd number of first IDT electrodes and an electrode parameter of an n-th second IDT electrode in the acoustic wave propagation direction among the odd number of second IDT electrodes are equal.

4. The acoustic wave filter device according to claim 1, further comprising a series arm resonator on at least one of a path connecting the first input/output terminal and the first node and a path connecting the second input/output terminal and the second node.

5. The acoustic wave filter device according to claim 1, further comprising a parallel arm resonator at at least one of a position between the ground and a node on a path connecting the first input/output terminal and the first node and a position between the ground and a node on a path connecting the second input/output terminal and the second node.

6. A multiplexer comprising:
a common terminal, a first terminal, and a second terminal;
the acoustic wave filter device according to claim 1, the acoustic wave filter device being disposed on a first path connecting the common terminal and the first terminal; and
a filter disposed on a second path connecting the common terminal and the second terminal and that has a passband different from a passband of the acoustic wave filter device.

7. The acoustic wave filter device according to claim 1, wherein the first longitudinally coupled acoustic wave resonator includes five of the first IDT electrodes.

8. The acoustic wave filter device according to claim 1, wherein the second longitudinally coupled acoustic wave resonator includes five of the second IDT electrodes.

9. The acoustic wave filter device according to claim 1, wherein the first longitudinally coupled acoustic wave resonator includes a pair of reflectors sandwiching the first IDT electrodes.

10. The acoustic wave filter device according to claim 1, wherein the second longitudinally coupled acoustic wave resonator includes a pair of reflectors sandwiching the second IDT electrodes.

11. The multiplexer according to claim 6, wherein the odd number of first IDT electrodes and the odd number of second IDT electrodes are equal in number.

12. The multiplexer according to claim 11, wherein an electrode parameter of an n-th first IDT electrode in the acoustic wave propagation direction among the odd number of first IDT electrodes and an electrode parameter of an n-th second IDT electrode in the acoustic wave propagation direction among the odd number of second IDT electrodes are equal.

13. The multiplexer according to claim 6, further comprising a series arm resonator on at least one of a path connecting the first input/output terminal and the first node and a path connecting the second input/output terminal and the second node.

14. The multiplexer according to claim 6, further comprising a parallel arm resonator at at least one of a position between the ground and a node on a path connecting the first input/output terminal and the first node and a position between the ground and a node on a path connecting the second input/output terminal and the second node.

15. The multiplexer according to claim 6, wherein the first longitudinally coupled acoustic wave resonator includes five of the first IDT electrodes.

16. The multiplexer according to claim 6, wherein the second longitudinally coupled acoustic wave resonator includes five of the second IDT electrodes.

17. The multiplexer according to claim 6, wherein the first longitudinally coupled acoustic wave resonator includes a pair of reflectors sandwiching the first IDT electrodes.

18. The multiplexer according to claim 6, wherein the second longitudinally coupled acoustic wave resonator includes a pair of reflectors sandwiching the second IDT electrodes.

* * * * *